United States Patent
Furman et al.

(10) Patent No.: US 8,156,998 B2
(45) Date of Patent: Apr. 17, 2012

(54) PATTERNED METAL THERMAL INTERFACE

(75) Inventors: Bruce K. Furman, Poughquag, NY (US); Sushumna Iruvanti, Wappingers Falls, NY (US); Paul A. Lauro, Brewster, NY (US); Yves C. Martin, Ossining, NY (US); Da Yuan Shih, Poughkeepsie, NY (US); Theodore G. Van Kessel, Millbrook, NY (US); Wei Zou, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 116 days.

(21) Appl. No.: 12/710,951

(22) Filed: Feb. 23, 2010

(65) Prior Publication Data
US 2010/0147497 A1   Jun. 17, 2010

Related U.S. Application Data

(63) Continuation of application No. 11/619,928, filed on Jan. 4, 2007, now Pat. No. 7,694,719.

(51) Int. Cl.
*F28F 7/00* (2006.01)
(52) U.S. Cl. ........................ 165/80.3; 165/185
(58) Field of Classification Search ............ 165/80.2, 165/80.3, 185; 361/704, 707, 709
See application file for complete search history.

(56) References Cited

U.S. PATENT DOCUMENTS

| | | | |
|---|---|---|---|
| 4,151,547 A | 4/1979 | Rhoades et al. | |
| 4,838,347 A | 6/1989 | Dentini et al. | |
| 5,161,090 A | 11/1992 | Crawford et al. | |
| 6,275,381 B1 | 8/2001 | Edwards et al. | |
| 6,504,242 B1 | 1/2003 | Deppisch et al. | |
| 7,137,444 B2 | 11/2006 | Faybishenko et al. | |
| 7,306,847 B2 | 12/2007 | Capp et al. | |
| 7,360,581 B2 | 4/2008 | Tuma et al. | |
| 7,593,228 B2 | 9/2009 | Jarrett et al. | |
| 7,694,719 B2 | 4/2010 | Furman et al. | |
| 2003/0112603 A1 | 6/2003 | Roesner et al. | |
| 2004/0190263 A1* | 9/2004 | Jadhav et al. | 361/708 |
| 2005/0068738 A1 | 3/2005 | Kim et al. | |
| 2005/0270744 A1 | 12/2005 | Farrow et al. | |
| 2006/0171124 A1 | 8/2006 | Capp et al. | |
| 2007/0102140 A1 | 5/2007 | Tuma et al. | |
| 2010/0147497 A1 | 6/2010 | Furman et al. | |

* cited by examiner

*Primary Examiner* — Teresa Walberg

(57) ABSTRACT

The present invention is a patterned metal thermal interface. In one embodiment a system for dissipating heat from a heat-generating device includes a heat sink having a first surface adapted for thermal coupling to a first surface of the heat generating device and a thermal interface having at least one patterned surface, the thermal interface being adapted to thermally couple the first surface of the heat sink to the first surface of the heat generating device. The patterned surface of the thermal interface allows the thermal interface to deform under compression between the heat sink and the heat generating device, leading to better conformity of the thermal interface to the surfaces of the heat sink and the heat generating device.

18 Claims, 5 Drawing Sheets

PATTERNED METAL THERMAL INTERFACE

CROSS REFERENCE TO RELATED APPLICATIONS

This application is a continuation of U.S. patent application Ser. No. 11/619,928, filed Jan. 4, 2007, now U.S. Pat. No. 7,694,719 which is herein incorporated by reference in its entirety.

FIELD OF THE INVENTION

The present invention relates generally to microprocessor and integrated circuits, and relates more particularly to the cooling of integrated circuit (IC) chips.

BACKGROUND OF THE INVENTION

Recent years have seen an evolution toward higher-power microprocessor, graphics, communication and memory semiconductor chips. This evolution in turn has driven interest in highly conductive solder thermal interface (STI) materials and liquid metal thermal interface (LMI) materials to provide improved thermal coupling between a chip and a heat sink. In both cases, it is an essential function of the thermal interface material that it thermally couple and adhere both to the chip and to the heat sink, in order to reduce the occurrence of failure in use (e.g., due to poor heat transfer between the chip and the heat sink).

A distinguishing feature of STI materials (which are understood to include low-melt solder materials that are solid at room temperature but may at least partially melt at normal chip process temperatures) is that they are composed of metal or metal alloys, such as gallium, indium, tin, lead or bismuth, among others. In some cases, these materials can attack or diffuse into other materials such as aluminum or copper, which are common heat sink materials. In other cases, these materials may fail to wet other materials such as silicon, silicon dioxide, silicon nitride or the like, which are common chip materials. De-wetting or degradation of the interface between the STI material and the heat sink, or between the STI material and the chip, can produce local hot spots that impede the thermal performance or cause outright failure of the chip in high-power applications. It is therefore desirable to provide a wetting or adhesion layer between a thermal interface material and a chip and/or between a thermal interface and a heat sink that maintains barrier properties and also isolates these mating surfaces from corrosive and adverse intermetallic formation with the interface metal.

Finally, both STI and LMI interfaces are conventionally applied in liquid phase. This requires the management of containment, void formation and intermetallic formations that are characteristic of liquid phase interactions. This is often difficult or impractical to achieve. Moreover, in cases where melting points exceed 125 degrees Celsius, attaching a heat sink would likely result in component failure.

Thus, there is a need for a metal thermal interface that provides good thermal coupling between a chip and a heat sink without the complicating need to enter liquid phase.

SUMMARY OF THE INVENTION

The present invention is a patterned metal thermal interface. In one embodiment a system for dissipating heat from a heat-generating device includes a heat sink having a first surface adapted for thermal coupling to a first surface of the heat generating device and a thermal interface formed a soft metal and having at least one patterned surface, the thermal interface being adapted to thermally couple the first surface of the heat sink to the first surface of the heat generating device. Patterning refers to an arrangement of local thick and thin spots on an otherwise flat foil or sheet of metal interface material. Many patterns are possible, and the precise distribution of thick and thin spots is chosen based on the application to give statistical uniformity. The patterned surface of the thermal interface allows the thermal interface to deform under compression between the heat sink and the heat generating device, leading to better conformity of the contact points of the thermal interface to the surfaces of the heat sink and the heat generating device.

The size and distribution of the thick and thin spots in the patterning is selected to account for the bow, warp and other surface properties of the heat generating device and of the heat sink. For instance, in an exemplary embodiment, the relative thickness between the thick and thin spots on the patterned thermal interface is 150 micron, with 200 micron pitch in a rectangular periodic array for an expected heat sink warping of approximately fifty micrometers During compression of the thermal interface (e.g., between the heat-generating device and the heat sink) the surface patterning of the thermal interface allows for local high pressure points uniformly distributed over the surface to be thermally coupled. This pressure causes the soft metal to creep and conform microscopically to the surfaces being thermally coupled, thereby providing good thermal contact at these points. Thermal coupling is further enhanced by the breakup of surface oxides, allowing metallic bonds to form at contact points between the metal interface material and the metal of the surfaces being thermally coupled. In one embodiment, moderate heat (e.g., not in excess of the thermal interface's melting point) is applied to accelerate the creep process. Embodiments of the invention intend that the thermal interface metal remain in solid phase during application and use.

In one embodiment, surface oxides of the thermal interface and of the contact surfaces of the heat generating device and the heat sink are managed in any one or more of a variety of ways. For example, in one embodiment, the thermal interface is fabricated immediately prior to use in order to limit the thickness of surface oxide. In another embodiment, at least one of the contact surfaces of the heat generating device, the heat sink and the thermal interface is treated with at least one of: an acid, a base, a plasma clean, a chemical cleaning agent or a mechanical abrasive. The treatment removes surface oxides prior to join or assembly of the heat sink assembly components. In another embodiment at least one of the contact surfaces of the heat generating device, the heat sink and the thermal interface is treated with at least one of: hydrochloric acid, oxalic acid, acetic acid, isopropyl alcohol, methyl alcohol, ethyl alcohol, acetone, and xylene. In yet another embodiment, at least one of the contact surfaces of the heat generating device, the heat sink and the thermal interface is treated with at least one of: sand blasting, sand paper, metal wool, cryogenic clean, and burnishing. In another embodiment still, at least one of the contact surfaces of the heat generating device, the heat sink and the thermal interface is treated with at least one of: reactive ion etch, plasma ashing, chemical down stream etching.

Since most heat sinks are clamped to heat-generating devices with significant force (e.g., 20 pounds or more) in order to compress thermal greases, the patterned metal thermal interface provides a practical high performance alternative with little or no change to existing assemblies. Pressure and optional heating are present during the application of the patterned metal interface. Once the thermal interface has been applied and bonded to the heat-generating device and to the heat sink, optional maintenance of pressure leads to better mechanical stability and robustness of the assembly. Reducing the amount of surface oxide on all mating surfaces of the heat-generating device and the heat sink prior to assembly further improves the thermal performance of the thermal interface.

The patterned metal thermal interface is intended as a general thermal interface solution. One particular area in which the thermal interface of the present invention may find use is between a computer chip comprised of silicon (and typically coated with silicon dioxide or silicon nitride) and a heat sink comprised of copper, nickel-plated copper or aluminum. A second area in which the thermal interface of the present invention may find use is between a lidded computer chip and a heat sink (similar to the heat sink described above), where the lid of the computer chip is comprised of copper or nickel-plated copper. Thus, the mating surfaces to be thermally coupled will, in many cases, be comprised of copper, nickel or silicon. In one embodiment, where the patterned metal thermal interface is comprised of indium or tin, the thermal interface can be directly applied to copper, nickel and silicon surfaces. In another embodiment, where the patterned metal thermal interface is comprised of silicon, a surface metallization is optionally applied to promote bonding and improve the thermal contact performance. If pressure is maintained during use, surface metallization of the thermal interface is not absolutely necessary, but will improve the thermal performance and reduce corrosion susceptibility.

In the most minimal embodiment, a patterned metal sheet is placed between heat-generating device and a heat sink and compressed with little or no surface preparation. For example, a patterned indium foil of approximately 200 micron thickness can be placed between a copper heat sink and a nickel-plated lidded computer chip in an assembly that exerts pressure on the foil sufficient to cause creep in the foil. In this configuration, there would be little bonding due to surface oxides, and both the thermal performance and the corrosion resistance of the thermal interface would be less than optimal. However, this performance is acceptable in most use cases. The thermal interface material will continue to creep during operation and is enhanced by the heat of operation. Creep will continue until an asymptotic stability is reached.

In addition to the thermal advantages of using the patterned metal thermal interface, there are advantages in rework. One of the most common thermal interface materials in use today is thermal grease. Thermal grease comprises oil containing thermally conductive particles. Thermal grease is extremely messy and difficult to clean during rework. The patterned metal thermal interface, by contrast, is dry and convenient to remove during rework by simply separating the heat sink from the heat-generating device and peeling or lightly scraping the patterned metal thermal interface off of the coupled surfaces.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

In one embodiment, the present invention is a thermal interface for use in dissipating heat from heat-generating devices (e.g., microprocessor chips). Embodiments of the present invention provide improved heat transfer from a heat generating device to a heat sink, thereby allowing for better heat dissipation from the heat generating device. This ultimately results in better performance of the heat generating device, as heat-related failures are minimized.

Figure 1:
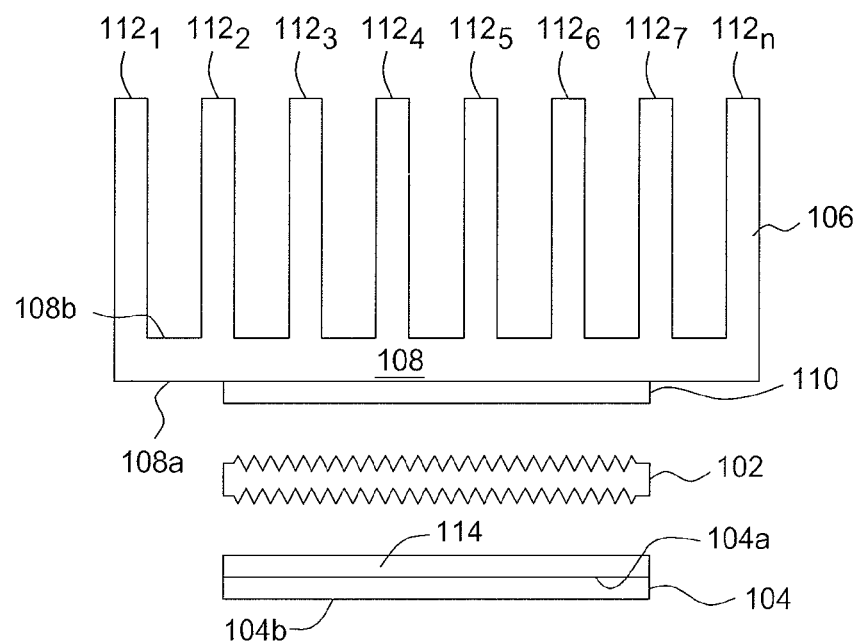
FIG. 1 is an exploded view of a heat sink assembly using a patterned metal thermal interface, according to one embodiment of the present invention.

FIG. 1 is an exploded view of a heat sink assembly 100 using a patterned metal thermal interface 102, according to one embodiment of the present invention. As illustrated, the heat sink assembly 100 comprises the thermal interface 102 disposed between a heat generating device 104 (e.g., a microprocessor chip or a lidded chip) and a heat sink 106. Alternatively, the heat sink 106 may be a lid where the heat generating device 104 is a microprocessor or semiconductor chip.

The heat sink 106 comprises a base 108 having first surface 108a and a second surface 108b. In one embodiment, the heat sink 106 comprises at least one of: a vapor chamber, a heat pipe or a liquid cooler. The first surface 108a of the base 108 is relatively flat and is configured to contact the thermal interface 102. To this end, the first surface 108a optionally comprises a first interface metallization layer 110. In one embodiment, the first interface metallization 110 layer comprises an adhesion layer and a wetting layer (i.e., such that the adhesion layer is "sandwiched" between the wetting layer and the first surface 108a of the base 108). For example, one embodiment of the first interface metallization layer 110 comprises a film of gold (wetting layer) deposited over a film of titanium (adhesion layer). In further embodiments, the adhesion layer comprises at least one of: titanium, a titanium-tungsten alloy, chromium, nickel, molybdenum or tantalum. In further embodiments, the wetting layer comprises at least one of: platinum, gold, an oil or an organic material. In a further embodiment, the first interface metallization layer 110 has a total thickness of approximately 2500 Angstroms, where the adhesion layer accounts for approximately 2000 Angstroms and the wetting layer accounts for approximately 500 Angstroms.

Many other embodiments of the first interface metallization layer 110 are possible. In one embodiment, the materials (i.e., for the adhesion and wetting layers) and thickness of the first interface metallization layer 110 are chosen such that: (1) the adhesion layer substantially adheres to the first surface 108a of the base 108; (2) the adhesion layer substantially isolates first surface 108a of the base 108 from chemical interaction; (3) the adhesion layer does not form substantial adverse intermetallics with the thermal interface 102; (4) the adhesion layer forms a metallic bond with the thermal interface 102 under heat and pressure; (5) the wetting layer substantially prevents oxide formation on the adhesion layer; (6) the wetting layer substantially adheres to the adhesion layer; and (7) the wetting layer is substantially malleable and bonds to the thermal interface 102. The respective thicknesses of the adhesion layer and the wetting layer are chosen with knowledge of the deposition process (e.g., sputtering, evaporation, jet process, etc.) to provide adhesion, coverage and low film stress.

Thus, in practice, the first interface metallization layer 110 provides a surface that is able to be bonded to a heat-generating device. Moreover, it is noted that in the case of metallic thermal interfaces, the more noble the metals that the thermal interface 102 is sandwiched between, the less susceptible the thermal interface 102 is to corrosion.

In a further embodiment, a transition layer is provided between the adhesion or barrier layer portion of the first interface metallization layer 110 and the wetting layer in order to create a diffuse boundary.

In a further embodiment, the first interface metallization layer 110 comprises a single metallic coating. For example, in one embodiment, the single coating comprises one of: gold, platinum, nickel, chrome or tungsten. In one embodiment, the material comprising the first interface metallization layer 110 is a more noble material than the material comprising the thermal interface 102. This is particularly advantageous in cases where bonding of the thermal interface 102 to the heat sink 106 and/or heat-generating device 104 is not required, and the heat sink assembly 100 is to be clamped with reasonable mechanical force for the duration of its useful lifetime.

In one embodiment, one or more of the surfaces of the heat sink 106, heat-generating device 104 and thermal interface 102 is coated with a bonding agent, such as an organic polymer adhesive, an epoxy resin or an oil. For example, in one embodiment, a thin (e.g., 100 nm) coating of epoxy is applied to the heat sink 106 and to the heat-generating device 104. The thermal interface 102 is then placed between the heat-generating device 104 and the heat sink 106, and mechanical force and heat are applied to compress the thermal interface 102 and to cure the bonding agent.

In another embodiment, no such coating is used. In this case, the thermal interface 102 is compressed between the heat-generating device 104 and the heat sink 106. This embodiment is advantageous in less hostile environments, where corrosion is less of a concern. This embodiment is also advantageous when the heat sink assembly 100 is to be clamped with mechanical force for the duration of its useful lifetime, but the advantages are not limited to this situation. For instance, advantages to the no coating embodiment may be realized where the heat sink 106 and the heat-generating device are made of compatible metals, and particularly where some degree of bonding can take place. A specific example is a patterned indium thermal interface compressed between a copper heat sink and a nickel-coated heat-generating device.

In this example, best results occur when care is taken to remove or minimize surface oxides prior to compression, and when heat is applied during initial compression as described further herein.

In one embodiment, the second surface 108b of the base 108 is also relatively flat and comprises a plurality of fins $112_1$-$112_n$ (hereinafter collectively referred to as "fins 112") coupled thereto. The fins 112 are positioned in a substantially perpendicular orientation relative to the base 108.

The heat generating device 104 also comprises a first surface 104a and a second surface 104b. In one embodiment, both the first surface 104a and the second surface 104b of the heat generating device 104 are relatively flat. The first surface 104a of the heat generating device 104 further comprises a second interface metallization layer 114. In one embodiment, the second interface metallization layer 114 is constructed in a manner similar to the first interface metallization layer 110 and comprises an adhesion layer and a wetting layer. In a further embodiment, a transition layer is provided between the adhesion layer of the second interface metallization layer 114 and the wetting layer in order to create a diffuse boundary.

The thermal interface 102 comprises a patterned metal foil, a metal mesh or a perforated metal sheet. The metal of the thermal interface is a solid metal (i.e., solid in phase). The foil is comprised of a relatively soft metal that deforms readily under moderate pressure. In one embodiment, the foil is comprised of at least one of: indium, lead, gold, silver, bismuth, antimony, tin, thallium or gallium. In another embodiment, the thermal interface 102 is comprised of a soft metal mesh. The thermal interface 102 is patterned or textured; that is, the thermal interface 102 exhibits a substantially uniform thickness and flatness but with local topography (high and low spots). In a further embodiment, the thermal interface 102 has a thickness of approximately 150 microns.

Figure 2:
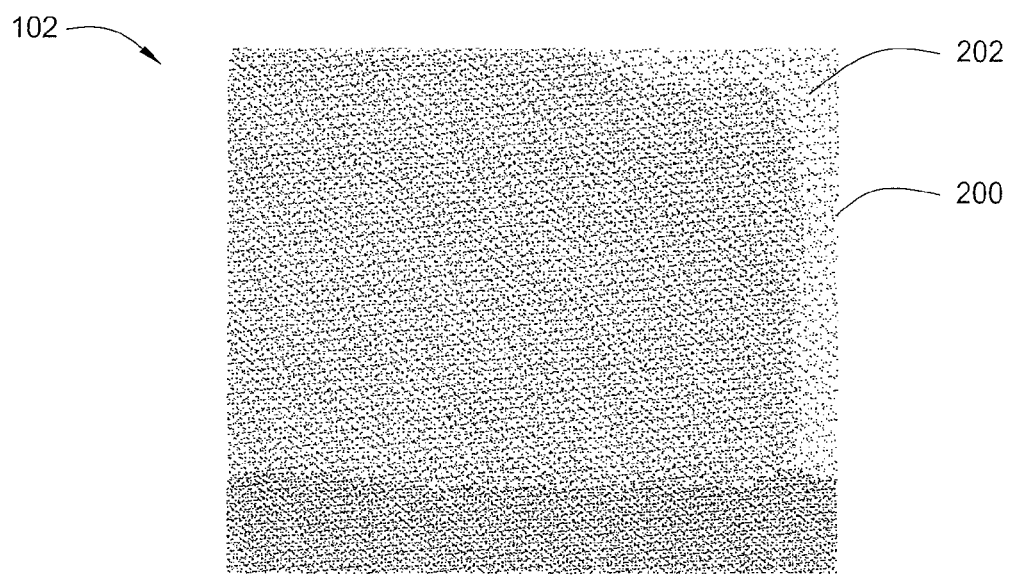
FIG. 2 is a plan view illustrating one embodiment of the thermal interface illustrated in FIG. 1, according to the present invention.

FIG. 2 is a plan view illustrating one embodiment of the thermal interface 102 illustrated in FIG. 1, according to the present invention. As illustrated, the surface of the thermal interface 102 is patterned or textured. In one embodiment, the pattern carried on the thermal interface 102 comprises one of many potential patterns. In one embodiment, the pattern has a topography that comprises high spots (e.g., spot 200) and low spots (e.g., spot 202). In a further embodiment, the pattern has a topology that allows for at least approximately fifty percent compression of the thermal interface 102 when the thermal interface 102 is pressed between a heat generating device and a heat sink. For example, in one embodiment, the pattern is a waffle pattern. In another embodiment, the pattern is a line pattern. In yet another embodiment, the pattern comprises at least approximately 100 microns of topology in parallel grooves, with approximately 0.5 mm pitch.

The use of the patterned thermal interface illustrated in FIGS. 1 and 2 provides improved heat transfer from the heat generating device 104 to the heat sink 106, thereby allowing for better heat dissipation from the heat generating device 104. Specifically, when pressed between the heat generating device 104 and the heat sink 106, the patterned thermal interface 102 deforms, allowing the thermal interface 102 to conform to the first surface 104a of the heat generating device 104 and to the first surface 108a of the heat sink base 108. Thus, heat generated by the heat generating device 104 is transferred to the base 108 of the heat sink 106, via the patterned thermal interface 102. The base 108 then spreads the heat to the fins 112 of the heat sink 106, from which the heat is carried by forced air (generated, e.g., by fans, not shown). The better the thermal coupling between the heat generating device 104 and the heat sink 106, the more heat that is dissipated by the heat sink assembly 100.

Figure 3:
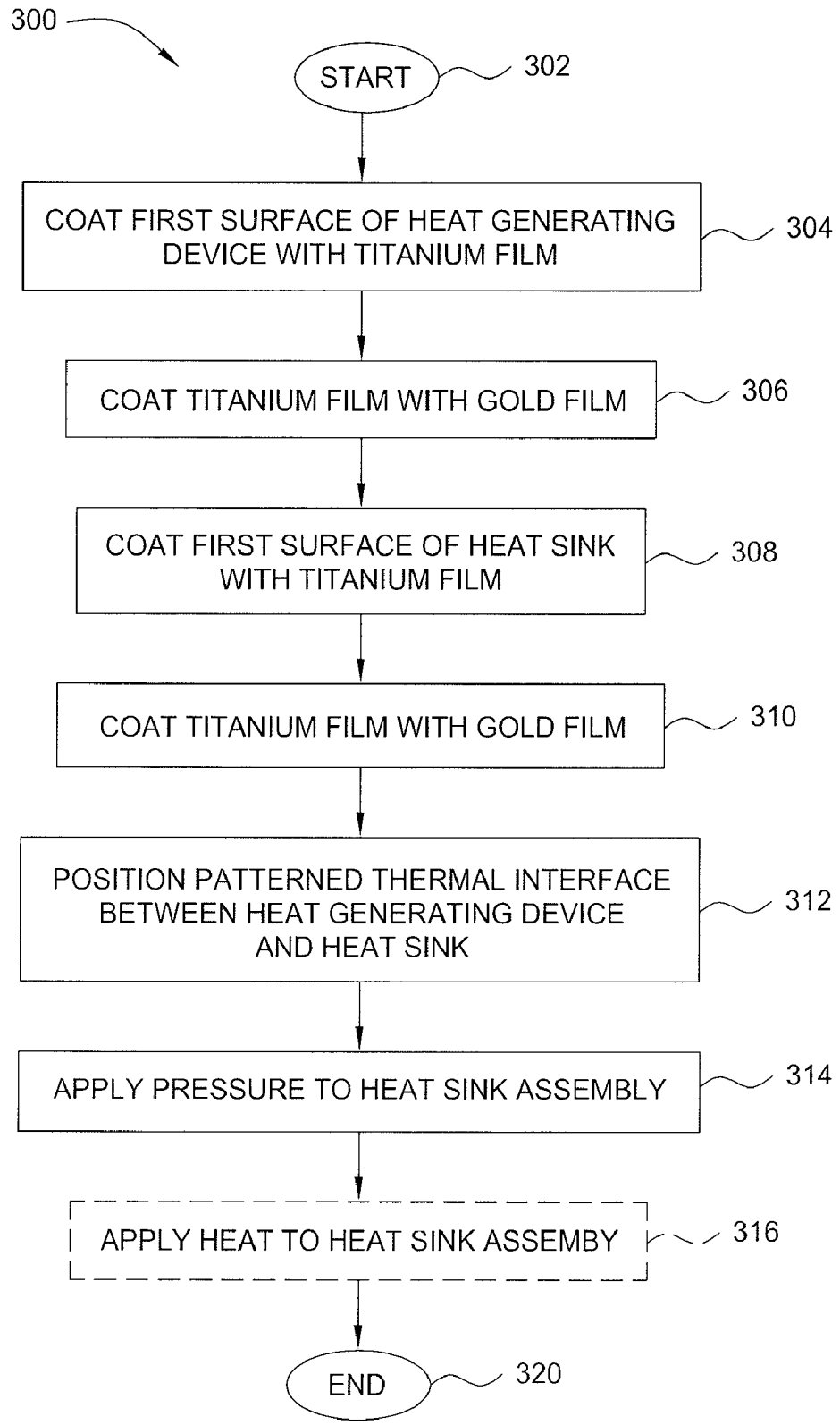
FIG. 3 is a flow diagram illustrating one embodiment of a method for assembling a heat sink assembly, according to the present invention.

FIG. 3 is a flow diagram illustrating one embodiment of a method 300 for assembling a heat sink assembly, according to the present invention. The method 300 may be implemented, for example, to assemble a heat sink assembly such as the heat sink assembly 100 illustrated in FIG. 1.

The method 300 is initialized at step 302 and proceeds to step 304, where the method 300 coats a first surface of a heat generating device with an adhesion film. The adhesion film comprises a film of material that does not alloy to an appreciable extent with the material of the thermal interface. In one embodiment, the adhesion film comprised at least one of: titanium, a titanium-tungsten alloy, chromium, nickel, molybdenum or tantalum. In one embodiment, the adhesion film is vacuum deposited. The method 300 then proceeds to step 306 and coats the adhesion film with a wetting film. In one embodiment, the wetting film comprises at least one of: gold or platinum. In one embodiment, the wetting film is vacuum deposited, in order to limit the amount of oxygen present when the wetting film material is applied to the adhesion film. The adhesion and wetting films together provide an interface metallization layer for the heat generating device. In an alternative embodiment, the adhesion/wetting film can be bulk evaporated or sputtered in reverse order onto a backing material (e.g., a polyimide) and then bonded (via pressure and/or heat) to the first surface of the heat generating device using a bonding agent (e.g., epoxy). The backing material would then be peeled away to reveal the wetting film surface. In this embodiment, care is taken to achieve a bond line of approximately 250 nanometers. Further embodiments include applying the adhesion/wetting film by plating, plasma spray or jet process.

In step 308, the method 300 coats a first surface of a heat sink with an adhesion film. In one embodiment, the adhesion film is vacuum deposited. The method 300 then proceeds to step 310 and coats the adhesion film with a wetting film. In one embodiment, the wetting film is vacuum deposited, in order to limit the amount of oxygen present when the wetting film material is applied to the adhesion film. The adhesion and wetting films together provide an interface metallization layer for the heat generating device. In an alternative embodiment, the adhesion/wetting film can be bulk evaporated or sputtered in reverse order onto a backing material (e.g., a polyimide) and then bonded (via pressure and/or heat) to the first surface of the heat sink using a bonding agent (e.g., epoxy). The backing material would then be peeled away to reveal the wetting film surface. In this embodiment, care is taken to achieve a bond line of approximately 250 nanometers.

In step 312, the method 300 positions a patterned metal thermal interface (such as the thermal interface illustrated in FIGS. 1 and 2) between the heat generating device and the heat sink. Specifically, the thermal interface is positioned between the first surface of the heat generating device and the first surface of the heat sink, both of which have been coated with an interface metallization layer as described above. In an alternative embodiment, the patterned metal thermal interface is pre-applied to the heat sink (e.g., by the heat sink manufacturer) prior to assembly in accordance with the method 300. In this case, the thermal interface may be patterned as part of the joining process to the heat sink (e.g., with a die or heated die). In one embodiment, the thermal interface is comprised of an indium foil. In one embodiment, the thermal interface has a thickness in the range of approximately 100 to 200 microns (e.g., approximately 150 microns). In one embodiment, the thermal interface is processed prior to deployment in the heat sink assembly in order to minimize surface oxides. In one embodiment, this processing involves rolling and patterning the thermal interface just prior to deployment to expose the oxide free metal. In another embodiment, the processing involves treating the thermal interface with a dilute acid, such as hydrochloric acid.

In step 314, the method 300 applies pressure to the heat sink assembly (i.e., the heat generating device, the heat sink and the thermal interface), in order to compress the thermal interface between the heat generating device and the heat sink. This pressure deforms the patterned thermal interface, allowing the thermal interface to conform to the first surface of the heat generating device and the first surface of the heat sink at a near-atomic scale. In one embodiment, the amount of pressure applied to the heat sink assembly is on the order of approximately ten to twenty kg/cm$^2$. In one embodiment, the heat sink is further held in place using screws, polymer glue, clips or other appropriate fastening means.

In optional step 316 (illustrated in phantom), the method 300 applies heat to the heat sink assembly. The application heat in addition to the continued application of pressure accelerates the alloying of the wetting film with the thermal interface material, resulting in a solid joint of the thermal interface material and the adhesion film material. In one embodiment, the heat applied to the heat sink assembly is in the range of approximately forty degrees Celsius to approximately 135 degrees Celsius. For example, in one embodiment, the heat applied to the heat sink assembly is on the order of approximately eighty-five degrees Celsius.

The method then terminates in step 320.

The method 300 thereby produces a heat sink assembly in which intimate contact is maintained between the thermal interface and the heat generating device, and between the thermal interface and the heat sink. In one embodiment, this contact comprises a continuous material connection that is mechanically and thermally stable due to the metallurgic effects of the pressure and heat applied thereto. During operation of the heat generating device, the thermal interface will typically remain clamped and under modest pressure between the heat generating device and the heat sink.

When fully compressed, the thermal interface will likely exhibit small breaks perpendicular to the interface plane as a result of incomplete collapse of the pattern carried on the thermal interface. These breaks allow the thermal interface material to expand and contract in response to thermal stresses, without generating large shear forces relative to the heat generating device and the heat sink. Thus, such discontinuities allow the conformed thermal interface to tolerate expansion differences between itself, the heat generating device and the heat sink, all of which are generally comprised of different materials having different thermal expansion properties.

In an alternative embodiment, rather than coating the surfaces of the heat generating device and the heat sink with the interface metallization layers, a bonding agent (e.g., epoxy) is applied to one or more of: the thermal interface, the first surface of the heat generating device and the first surface of the heat sink. The components are assembled, and the interface is then pressed and cured by the application of the heat. In this case, a thin bond line (e.g., approximately 250 nanometers or less in thickness) is maintained. In a further embodiment, the heat sink is first cleaned of most surface oxides before bonding, and heat is applied for a period of hours (e.g., approximately ten to twenty hours) at a temperature in the range of approximately forty degrees Celsius to approximately 135 degrees Celsius (e.g., approximately ninety degrees Celsius). Bonding provides the advantages of convenience, speed and simplicity; however, coating with an interface metallization layer provides better resistance to corrosion.

Those skilled in the art will appreciate that many materials other than titanium and gold may be used to form the interface metallization layer. In general, any material or combination of materials that provides: (1) good adherence to the heat generating device and the heat sink; (2) limited solubility and limited intermetallic activity with respect to the thermal interface material; (3) limited surface oxidation (potentially achieved by capping a first material with a noble metal); and (4) ready alloying to the thermal interface material (again potentially achieved by capping a first material with a noble metal).

Figure 4:
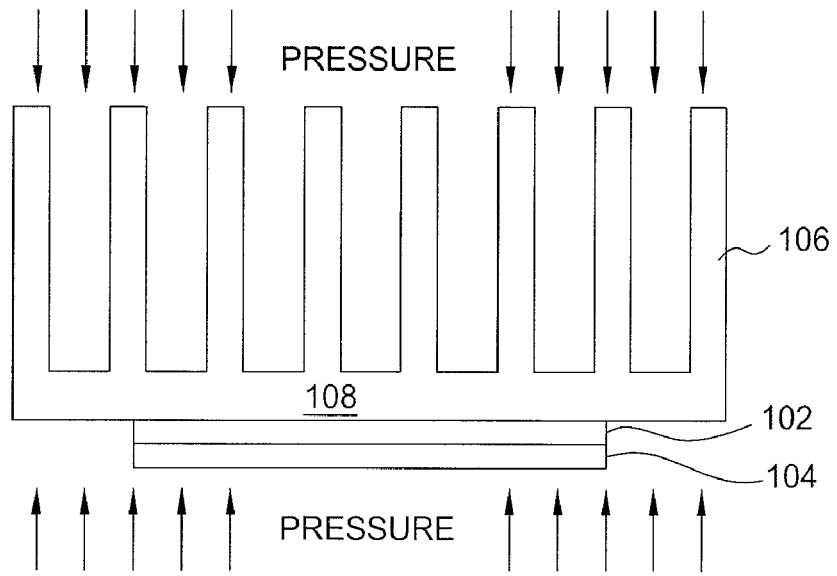
FIG. 4 is a schematic diagram illustrating one embodiment of the assembled heat sink assembly illustrated in FIG. 1, where the heat sink assembly is assembled according to the method illustrated in FIG. 3.

FIG. 4 is a schematic diagram illustrating one embodiment of the assembled heat sink assembly 100 illustrated in FIG. 1, where the heat sink assembly 100 is assembled according to the method 300 illustrated in FIG. 3. As illustrated, the thermal interface 102 is compressed between the heat generating device 104 and the heat sink 106 such that the thermal interface conforms to the surfaces of the heat generating device 104 and the heat sink 106.

Figure 5:
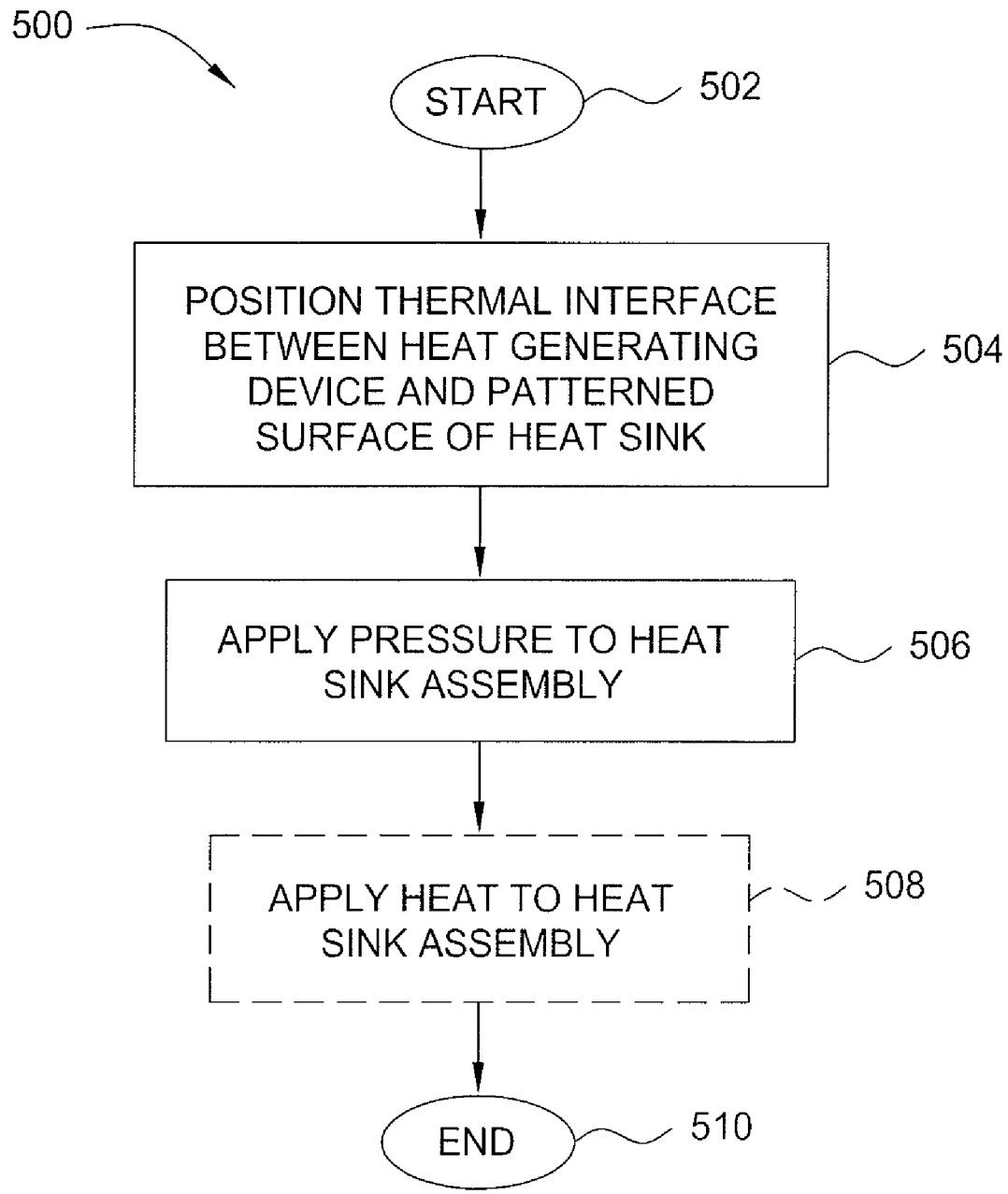
FIG. 5 is a flow diagram illustrating a second embodiment of a method for assembling a heat sink assembly, according to the present invention.

FIG. 5 is a flow diagram illustrating a second embodiment of a method 500 for assembling a heat sink assembly, according to the present invention. The method 500 may be implemented, for example, to assemble a heat sink assembly such as the heat sink assembly 100 illustrated in FIG. 1.

The method 500 is initialized at step 502 and proceeds to step 504, where the method 500 positions a thermal interface between a first surface of a heat generating device and a patterned first surface of a heat sink. In one embodiment, the thermal interface comprises a substantially flat, smooth metal foil. In one embodiment, the foil is comprised of indium. The first surface of the heat sink is patterned with a relief structure.

In step 506, the method 500 applies pressure to the heat sink assembly, such that the thermal interface is compressed between the first surface of the heat generating device and the first surface of the heat sink. Compression causes the first surface of the heat sink to impress the pattern carried thereon into the thermal interface, locally deforming the thermal interface and allowing the thermal interface to conform to the first surface of the heat generating device and the first surface of the heat sink at a near-atomic scale. In one embodiment, the heat sink is further held in place using screws, polymer glue, clips or other appropriate fastening means.

In optional step 508 (illustrated in phantom), the method 500 applies heat to the heat sink assembly before terminating in step 510.

An advantage of the method 500 is that is allows direct thermal coupling of vapor chamber heat sinks to high-power semiconductor or microprocessor chips without requiring the high temperatures normally needed for solder attachment. Moreover, compliant metal interfaces may be used without vacuum chip metallization in the case of organic bonding. Ultimately, these advantages result in improved thermal performance in the range of two to five $mm^2$ C/W.

Figure 6:
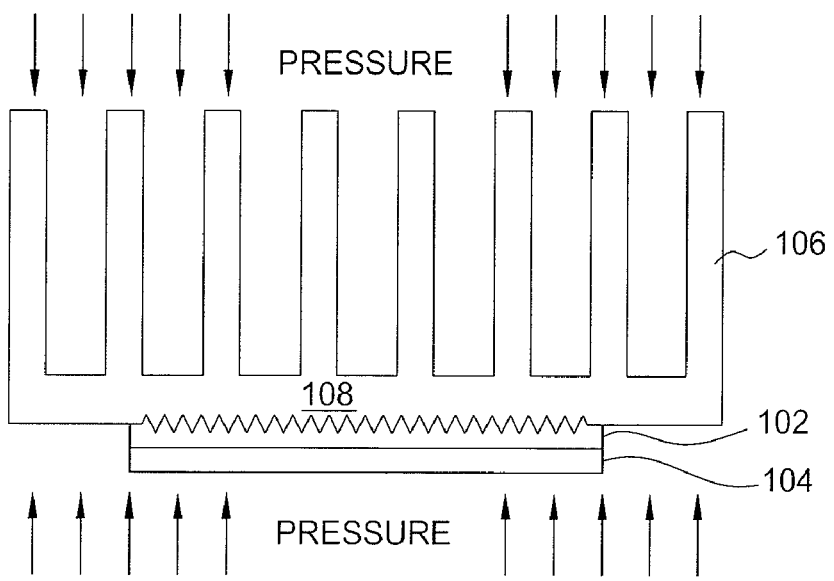
FIG. 6 is a schematic diagram illustrating one embodiment of the assembled heat sink assembly illustrated in FIG. 1, where the heat sink assembly is assembled according to the method illustrated in FIG. 5.

FIG. 6 is a schematic diagram illustrating one embodiment of the assembled heat sink assembly 100 illustrated in FIG. 1, where the heat sink assembly 100 is assembled according to the method 500 illustrated in FIG. 5. As illustrated, the thermal interface 102 is compressed between the heat generating device 104 and the heat sink 106 such that the thermal interface conforms to the surfaces of the heat generating device 104 and the heat sink 106.

Figure 7:
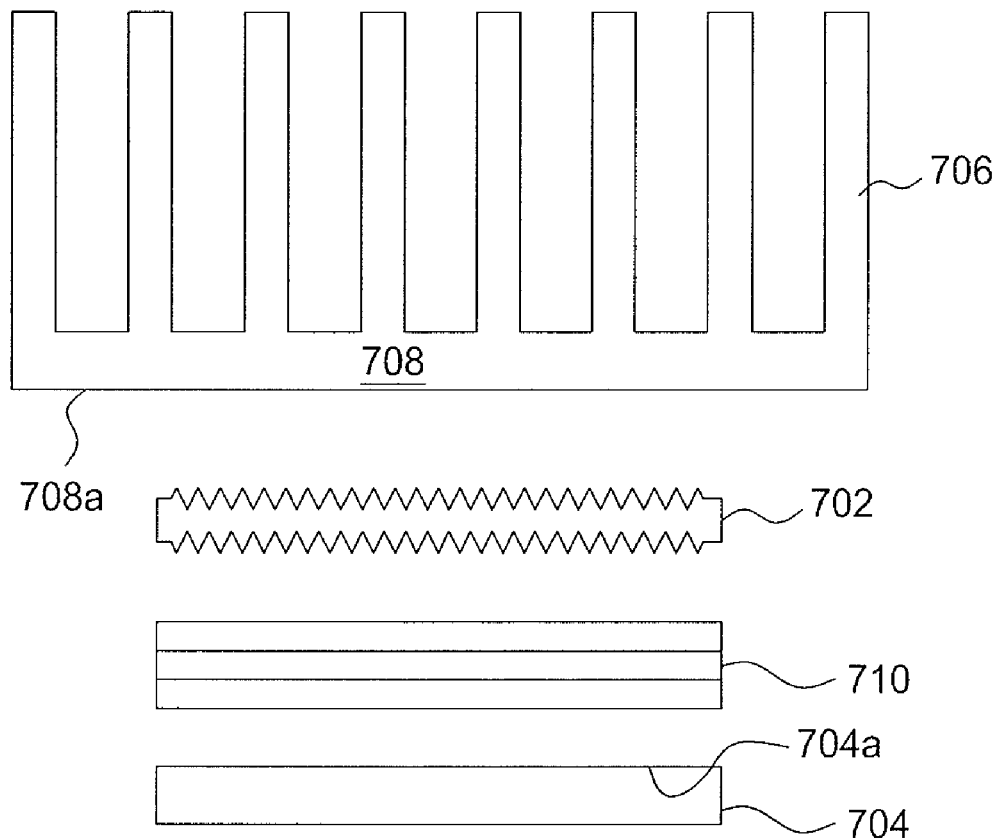
FIG. 7 is an exploded view illustrating one embodiment of a heat sink assembly, in which the adhesion/wetting/bonding layers comprise an insert or film that is separately formed and then applied to the heat sink assembly.

FIG. 7 is an exploded view illustrating one embodiment of a heat sink assembly 700, in which the adhesion/wetting/bonding layers comprise an insert or film 710 that is separately formed and then applied to the heat sink assembly 700. As illustrated, the film 710 may be positioned between the thermal interface 702 and a first surface 704a of the heat generating device 704. Alternatively, the film 710 may be positioned between the thermal interface 702 and a first surface 708a of the heat sink 708. Moreover, the film 710 may be formed with any combination of one or more of the adhesion layer, the wetting layer and the bonding layer.

Thus, a thermal interface is disclosed that provides improved heat transfer from a heat generating device to a heat sink, thereby allowing for better heat dissipation from the heat generating device. This ultimately results in better performance of the heat generating device, as heat-related failures are minimized.

While foregoing is directed to the preferred embodiment of the present invention, other and further embodiments of the invention may be devised without departing from the basic scope thereof, and the scope thereof is determined by the claims that follow.

The invention claimed is:

1. A system for dissipating heat from a heat generating device, comprising:
   a heat sink having a first surface adapted for thermal coupling to a first surface of the heat generating device; and
   a solid metal thermal interface having at least one patterned surface, the thermal interface being adapted to thermally couple the first surface of the heat sink to the first surface of the heat generating device, wherein the first surface of the heat sink comprises a relief pattern that matches the at least one patterned surface.

2. The system of claim 1, wherein a thickness and a flatness of the at least one patterned surface are substantially uniform, but the patterned surface exhibits local thick spots and thin spots.

3. The system of claim 2, wherein the thermal interface comprises a soft metal that deforms readily under pressure.

4. The system of claim 3, wherein the thermal interface comprises at least one of: a patterned foil, a metal mesh, or a perforated metal sheet.

5. The system of claim 2, wherein the thermal interface comprises indium.

6. The system of claim 2, wherein the thermal interface comprises lead.

7. The system of claim 2, wherein the thermal interface comprises gold.

8. The system of claim 2, wherein the thermal interface comprises silver.

9. The system of claim 2, wherein the thermal interface comprises bismuth.

10. The system of claim 2, wherein the thermal interface comprises antimony.

11. The system of claim 2, wherein the thermal interface comprises tin.

12. The system of claim 2, wherein the thermal interface comprises thallium.

13. The system of claim 2, wherein the thermal interface comprises gallium.

14. The system of claim 2, wherein the at least one patterned surface has a topography that allows for at least fifty percent compression of the thermal interface when the thermal interface is compressed between the heat generating device and the heat sink.

15. The system of claim 1, wherein the at least one patterned surface includes breaks that allow the thermal interface to expand and contract in response to thermal stress.

16. The system of claim 1, wherein the thermal interface is compressed between the first surface of the heat sink and the first surface of the heat generating device.

17. The system of claim 16, wherein the at least one patterned surface conforms to the first surface of the heat sink and to the first surface of the heat generating device to form a continuous material connection.

18. The system of claim 1, wherein a solid joint exists between the first surface of the thermal interface and the first surface of the heat sink.

* * * * *